(12) United States Patent
McGrath

(10) Patent No.: US 10,937,835 B2
(45) Date of Patent: Mar. 2, 2021

(54) LOW-NOISE INTEGRATED POST-PROCESSED PHOTODIODE

(71) Applicant: BAE Systems Imaging Solutions Inc., San Jose, CA (US)

(72) Inventor: Robert Daniel McGrath, Lexington, MA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 0 days.

(21) Appl. No.: 16/198,247

(22) Filed: Nov. 21, 2018

(65) Prior Publication Data
US 2020/0161374 A1 May 21, 2020

(51) Int. Cl.
*H01L 27/30* (2006.01)
*H01L 27/146* (2006.01)
*H01L 51/44* (2006.01)

(52) U.S. Cl.
CPC ...... *H01L 27/307* (2013.01); *H01L 27/14612* (2013.01); *H01L 27/14636* (2013.01); *H01L 27/14643* (2013.01); *H01L 27/1463* (2013.01); *H01L 27/14689* (2013.01); *H01L 51/442* (2013.01)

(58) Field of Classification Search
CPC ............ H01L 27/307; H01L 27/14612; H01L 27/14636; H01L 27/14643; H01L 27/1463; H01L 27/14689; H01L 51/442
See application file for complete search history.

(56) References Cited

U.S. PATENT DOCUMENTS

| | | | |
|---|---|---|---|
| 6,984,537 B2 * | 1/2006 | Fossum | H01L 27/14603 257/E27.132 |
| 2005/0104089 A1 | 5/2005 | Engelmann et al. | |
| 2008/0315263 A1 | 12/2008 | Rhodehouse | |
| 2014/0306182 A1 | 10/2014 | Toda | |
| 2015/0008493 A1 | 1/2015 | Ni | |
| 2016/0021319 A1 * | 1/2016 | Okamoto | H01L 27/14643 250/201.1 |
| 2016/0225804 A1 * | 8/2016 | Li | H01L 27/14612 |
| 2016/0360133 A1 | 12/2016 | Ganguly et al. | |
| 2017/0018584 A1 | 1/2017 | Ma et al. | |
| 2017/0229509 A1 | 8/2017 | Lee et al. | |
| 2017/0293791 A1 * | 10/2017 | Mainguet | G06K 9/0002 |

OTHER PUBLICATIONS

International Search Report, PCT/US19/62216, dated Jan. 28, 2020, 8 pages.

* cited by examiner

*Primary Examiner* — Fernando L Toledo
*Assistant Examiner* — Valerie N Newton
(74) *Attorney, Agent, or Firm* — Maine Cernota & Rardin; Scott J. Asmus

(57) ABSTRACT

A pixel, is provided the pixel comprising: a photodiode structure built on top of an integrated circuit generating a charge; the integrated circuit comprising at least one semiconductor material and at least one interconnect layer; the at least one interconnect layer comprises an interconnect to facilitate charge flowing into a collection node disposed in the semiconductor material; the interconnect being in contact with a doped contact diffusion disposed proximate to the collection node; a transfer transistor disposed between the collection node and a conversion node, the conversion node coupled to an active transistor; the pixel having a reset configured to reset the conversion node.

11 Claims, 3 Drawing Sheets

LOW-NOISE INTEGRATED POST-PROCESSED PHOTODIODE

FIELD

The disclosure relates to Post Processed Photodiodes, and more particularly, to a post processed photodiode where the photodiode structure is fabricated on a CMOS readout circuit.

BACKGROUND

Organic photodiodes 1 including ones which are made light sensitive by the use of embedded nanoparticles have demonstrated ability to have response that is better than silicon into the Near Infra-Red (NIR) and Short Wave Infra-Red (SWIR) and to have either selective or broadband wavelength response. The two advantages are that this sensitivity allows them to be thin and to be fabricated on a front-side illuminated image sensor above the metal interconnect layers 2 providing low f-number response. But the published devices use a "3T" pixel architecture, having no transfer node TX between the diode and the reset node, such as that illustrated in FIGS. 1 and 2 with a conversion node 3 providing contact from photodiode to readout, which has been presumed to be necessarily a highly doped diffusion 4 of the same type as the photocarrier—this prevents the operation with true correlated double sampling leading to increased noise over conventional CMOS image sensors.

What is needed, therefore, a design for photodiode structure fabricated on a CMOS readout circuit.

BRIEF SUMMARY

One embodiment provides a pixel, the pixel comprising: a photodiode structure built on top of an integrated circuit generating a charge; the integrated circuit comprising at least one semiconductor material and at least one interconnect layer; the at least one interconnect layer comprises an interconnect to facilitate charge flowing into a collection node disposed in the semiconductor material; the interconnect being in contact with a doped contact diffusion disposed proximate to the collection node; a transfer transistor disposed between the collection node and a conversion node, the conversion node coupled to an active transistor; the pixel having a reset configured to reset the conversion node.

Another embodiment provides such a pixel wherein the integrated circuit is built in a metal oxide semiconductor (MOS) process.

A further embodiment provides such a pixel wherein the integrated circuit is built in a complementary metal oxide semiconductor (CMOS) process.

Still another embodiment provides such a pixel wherein the doped contact diffusion is doped to a degree that it forms a layer that is conductive under operation.

A still further embodiment provides such a pixel wherein the doped contact diffusion isolates aid collection node from defects in an interface between the at least one interconnect layer and the at least one semiconductor material.

Even another embodiment provides such a pixel wherein the at least one interconnect layer comprises a plurality of interconnect layers selected from the group of layers consisting of a dielectric layer and a conductive layer.

An even further embodiment provides such a pixel wherein the reset enables the use of correlated double sampling.

Yet another embodiment provides such a pixel wherein the photodiode comprises at least one organic material.

Still yet another embodiment provides such a pixel wherein the photodiode further comprises semiconductor material dispersed within the at least one organic material.

One embodiment of the present invention provides a sensor, the sensor comprising: An array of pixels; Each the pixel in the array comprising a photodiode structure built on top of an integrated circuit generating a charge; the integrated circuit comprising at least one semiconductor material and at least one interconnect layer; at least one interconnect layer comprises an interconnect to facilitate charge flowing into a collection node disposed in the semiconductor material; the interconnect being in contact with a doped contact diffusion disposed proximate to the collection node; a transfer transistor disposed between the collection node and a conversion node, the conversion node coupled to an active transistor; each the pixel having a reset configured to reset the conversion node; at least one bias circuit providing bias to the array; at least one clock circuit providing clocking to the array; and at least one signal chain circuit detecting the signal output by at least one pixel of the array.

Another embodiment provides such a sensor wherein the integrated circuit is built in a metal oxide semiconductor (MOS) process.

A further embodiment provides such a sensor wherein the integrated circuit is built in a complementary metal oxide semiconductor (CMOS) process.

Yet another embodiment provides such a sensor wherein the doped contact diffusion is doped to a degree that it forms a layer that is conductive under operation.

A yet further embodiment provides such a sensor wherein the doped contact diffusion isolates aid collection node from defects in an interface between the at least one interconnect layer and the at least one semiconductor material.

Even another embodiment provides such a sensor wherein the at least one interconnect layer comprises a plurality of interconnect layers selected from the group of layers consisting of a dielectric layer and a conductive layer.

An even further embodiment provides such a sensor wherein the reset enables the use of correlated double sampling.

Still yet another embodiment provides such a sensor wherein the photodiode comprises at least one organic material.

Even yet another embodiment provides such a sensor wherein the photodiode further comprises semiconductor material dispersed within the at least one organic material.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
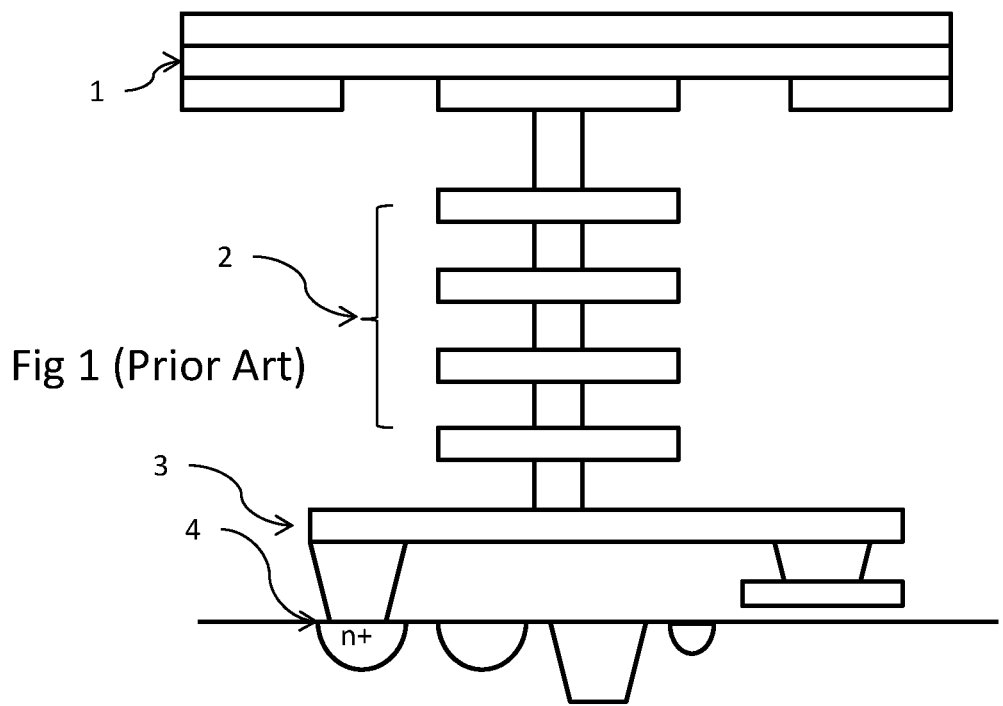
FIG. 1 is a block diagram illustrating an elevation view of a known pixel.
Figure 2:
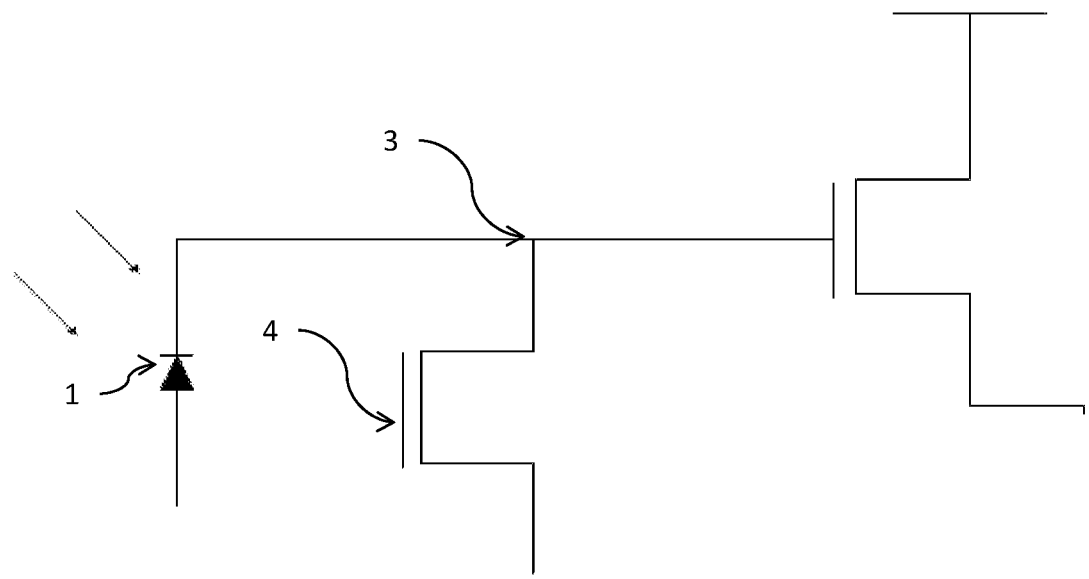
FIG. 2 is a circuit diagram illustrating a pixel configured according to FIG. 1.
Figure 3:
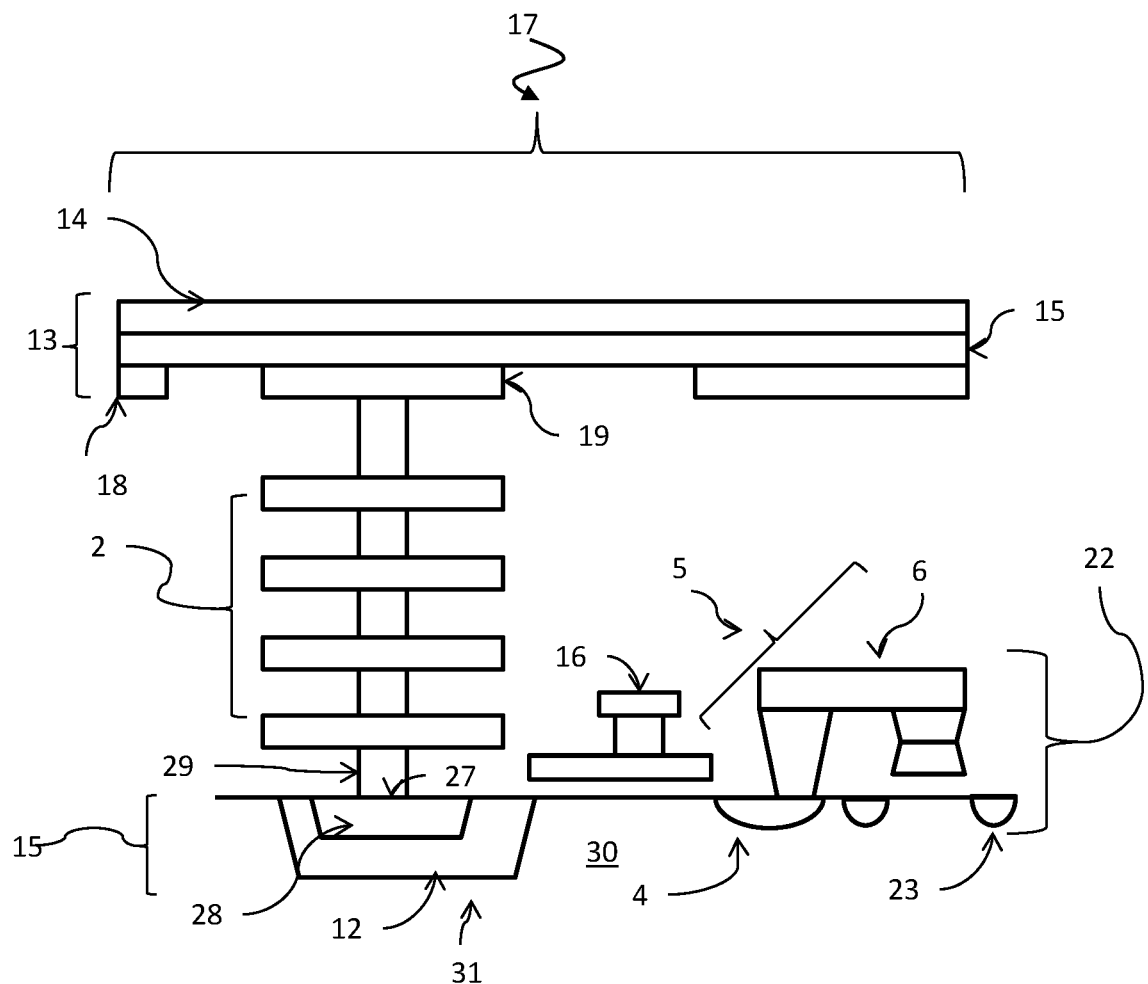
FIG. 3 is a block diagram of a pixel configured according to one embodiment.

A system according to one embodiment, as illustrated in FIG. 3, is provided where a pixel 17 consists in part of a photodiode structure 13, an interconnect 2, a contact 27, a collection node 31, a transfer (TX) transistor 16, a conversion node 6 and an active transistor 22. Photons impinging on the photodiode 13, consisting of a transparent electrode 14, a photodiode layer 18 and a photodiode electrode 19, generate photocarriers that as a result of the bias on the photodiode 13 are conducted through the interconnect 2 to the contact 27, consisting of a contact metal 29 and a heavily doped contact diffusion region 28 and injected into the collection node 31, consisting of a collection diffusion 12 located in the substrate doping 30. The photocarriers in the collection node 31 are readout by operating the transfer transistor 16 so as to create potential channel to the conversion node 5, consisting of a conversion diffusion 4 and an interconnect, 6, to the active transistor 22 where it modulates the signal output by the active transistor 22. The difference between the signal on the output diffusion, 23, of the active transistor, 22, before and after the operation of the transfer transistor 16 in deterministically related to the number of photocarriers generated on the photodiode 13.

Embodiments of the present disclosure, in contrast to known systems, provide a contact 27 comprising a conductor metal contact 29 and contact diffusion 28 of the opposite doping type from the collection node diffusion 12. The signal charge in the contact diffusion 28 being provided with minority carriers, allowing "4T" operation with true correlated-double sampling, thereby allowing the removal of reset noise. The contact conductor 29 associated with the contact diffusion 28 should have a work function that is near the conduction band for the diffusion. The contact diffusion 28 serves as a pinning layer for holding the control potential near the interface. In this case the photocurrent from the photodiode will be minority carriers injected into the contact diffusion 28. The large barrier in the contact diffusion 28 between the valence band and the conductor 29 with respect to the valence band will prevent the current from being majority carriers injected into the contact conductor 29. This means that the photocurrent injected into the contact diffusion 28 will then transport into the potential well created by the collection node structure 31 that acts to integrate the signal charge until readout. The result is that the device according to such an embodiment would be able to operate with decreased noise.

Figure 4:
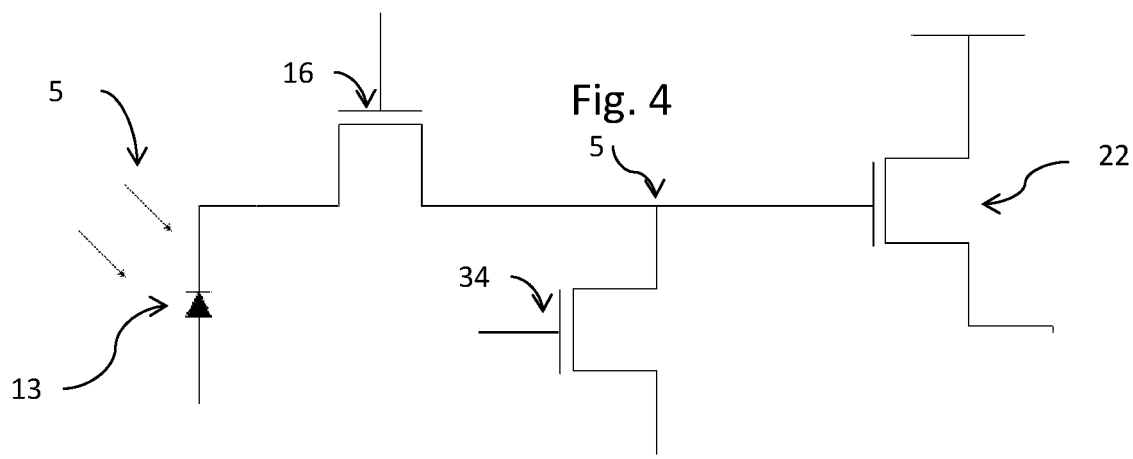
FIG. 4 is a circuit diagram of a pixel configured according to one embodiment.

As illustrated in FIG. 4, photons 5 impinge on the photodiode 13 generating photocarriers. A transfer node TX 16 is disposed between the photodiode 13 and the conversion node 5 comprising the conversion diffusion 4 and a reset transistor 34 is disposed between the reset bias and the conversion node 5 allowing for correlated double sampling and the removal of reset noise outputted through the active transistor 22.

As illustrated in FIG. 4, photons 5 impinge on the photodiode 13 generating photocarriers. A transfer node TX 16 is disposed between the photodiode 13 and the conversion node 5 comprising the conversion diffusion 4 and a reset transistor 34 is disposed between the a reset bias and the conversion node 6 allowing for correlated double sampling and the removal of reset noise outputted through the active transistor 22.

Figure 5:
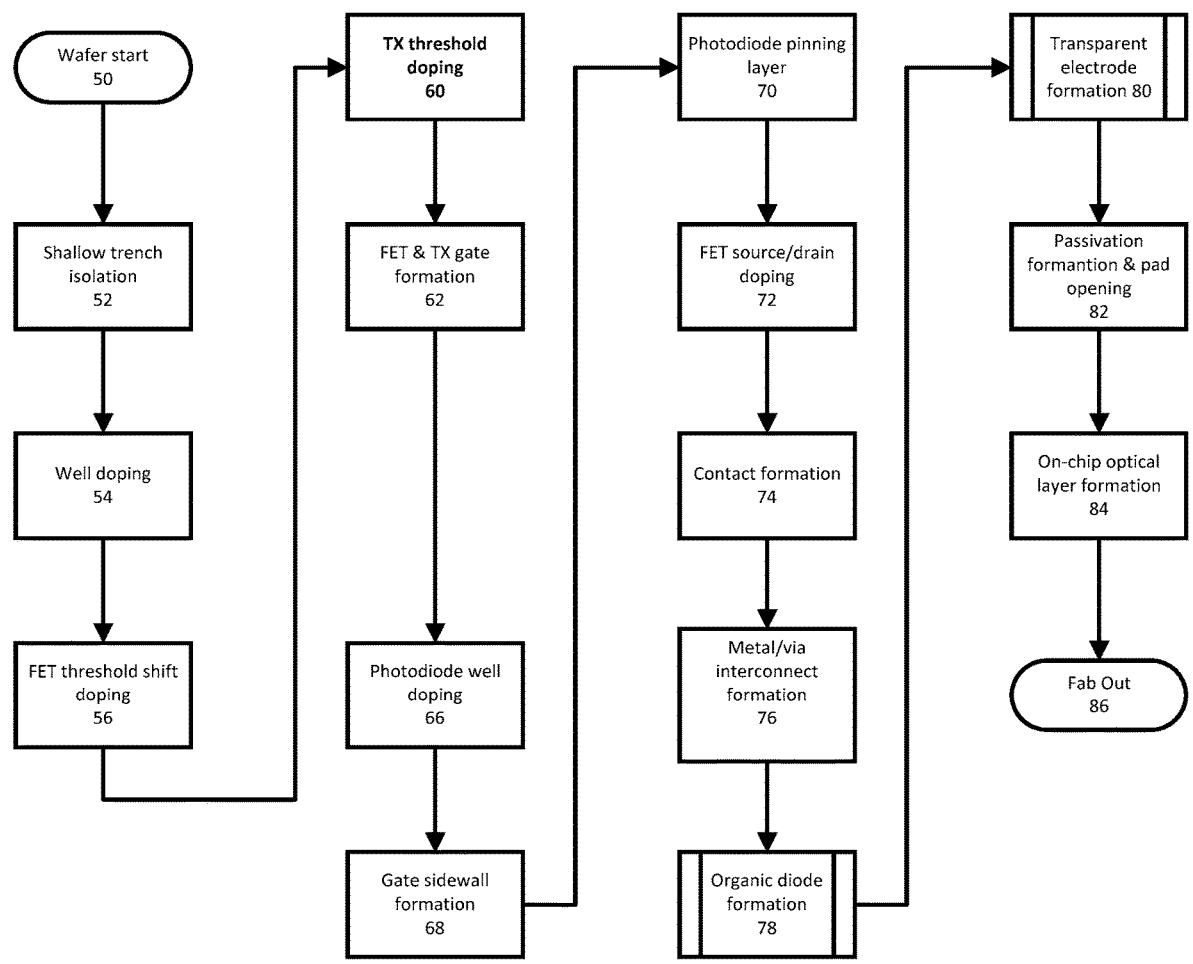
FIG. 5 is a flow chart illustrating a method for making the pixel configured according to one embodiment.

As illustrated in the flowchart of FIG. 5, a system configured according to one such embodiment is manufactured by starting with a wafer substrate 50 and isolating pixels with shallow trenches 52. Regions of pixels desired to be wells are then doped 54 as are the Field effect transistor (FET) Threshold shift region 56 and the TX threshold 60. The FET and TX gates are then formed 62. Photodiode well is doped 66 and gate sidewall is formed 68. Subsequently, a photodiode pinning layer is applied 70. FET source and drain are doped 72. Contacts are then formed 74 as are metal vias and interconnects 76.

In one embodiment, the photodiode layer could be made up of photoactive conductive organic diode material(s) that cover the pixel array. In one embodiment the material of the photodiode may be made up of conductive organic material(s) containing a suspension of photoactive material that covers the pixel array. An example of such a photoactive material is nanoparticles.

Organic diodes that are formed 78 though alternative embodiments could use suitable other diode designs, as for example, a transparent electrode formation 80. Passivation formation and pad opening is performed 82 and on chip optical formation 84 is carried out before the sensor fabrication process is complete 86.

These options for organic diodes can be associated with completed circuitry built fabricated through design methodologies and process procedures typical to a complementary metal-oxide-semiconductor (CMOS) process typical to those familiar to the manufacturing technology.

As described above, in one embodiment, illustrated in FIG. 3, a pixel 17 is provided, having a photodiode structure 13 built on top of an integrated circuit generating a charge; the integrated circuit comprising at least one semiconductor material 15 and at least one interconnect layer; the at least one interconnect layer comprises an interconnect 2 to facilitate charge flowing into a collection node 31 disposed in the semiconductor material; the interconnect 2 being in contact with a doped contact diffusion 28 disposed proximate to the collection node 31; a transfer transistor disposed between the collection node 31 and a conversion node 5 the conversion node 5 coupled to an active transistor 22; the pixel 17 having a reset 34 configured to reset the conversion node 6.

Such a pixel 17 may have an integrated circuit that is built in a metal oxide semiconductor (MOS) process or that is built in a complementary metal oxide semiconductor (CMOS) process.

The doped contact diffusion 28 may be doped to a degree that it forms a layer that is conductive under operation or the doped contact diffusion 28 isolates the collection node 31 from defects in an interface between the at least one interconnect layer and the at least one semiconductor material.

Such a pixel 17 can be configured wherein the at least one interconnect layer comprises a plurality of interconnect layers selected from the group of layers consisting of a dielectric layer and a conductive layer and/or wherein the reset enables the use of correlated double sampling.

One embodiment provides such a pixel 17 wherein the photodiode 13 comprises at least one organic material, and that the organic material may have semiconductor material dispersed within the at least one organic material.

One embodiment of the present invention provides a sensor, the sensor comprising: An array of pixels 17; the pixels 17 in the array comprising a photodiode structure 13 built on top of an integrated circuit generating a charge; the integrated circuit comprising at least one semiconductor material and at least one interconnect layer; the at least one interconnect layer comprises an interconnect 2 to facilitate charge flowing into a collection node 31 disposed in the semiconductor material; the interconnect 2 being in contact with a doped contact diffusion 28 disposed proximate to the collection node 31; a transfer transistor 16 disposed between the collection node 31 and a conversion node 5, the conversion node 5 coupled to an active transistor 22; each the pixel 17 having a reset configured to reset the conversion node 5; at least one bias circuit providing bias to the array; at least one clock circuit providing clocking to the array; and at least one signal chain circuit detecting the signal output by at least one pixel 17 of the array.

Another embodiment provides such a sensor wherein the integrated circuit is built in a metal oxide semiconductor (MOS) process or a complementary metal oxide semiconductor (CMOS) process.

Such a sensor may have a doped contact diffusion 28 that is doped to a degree that it forms a layer that is conductive under operation or wherein the doped contact diffusion 28 isolates aid the collection node 31 from defects in an interface between the at least one interconnect layer and the at least one semiconductor material.

One embodiment provides such a sensor wherein the at least one interconnect layer comprises a plurality of interconnect layers selected from the group of layers consisting of a dielectric layer and a conductive layer and/or wherein the reset enables the use of correlated double sampling.

Still yet another embodiment provides such a sensor wherein the photodiode comprises at least one organic material a semiconductor material dispersed within the at least one organic material.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A pixel, the pixel comprising:
   a photodiode structure built on an integrated circuit and generating a charge;
       said integrated circuit comprising at least one semiconductor material and at least one interconnect layer;
       said at least one interconnect layer comprises an interconnect to facilitate said charge flowing into a collection node disposed in said at least one semiconductor material;
   a doped contact diffusion region disposed between said interconnect layer and said collection node, said doped contact diffusion region being in contact with said interconnect, wherein the doped contact diffusion region is an opposite doping type than the collection node;
   a transfer transistor disposed between said collection node and a conversion node, said conversion node coupled to an active transistor;
   said pixel having a reset configured to reset said conversion node.

2. The pixel of claim 1 where said integrated circuit is built in a metal oxide semiconductor (MOS) process.

3. The pixel of claim 1 wherein said integrated circuit is built in a complementary metal oxide semiconductor (CMOS) process.

4. The pixel of claim 1, wherein said doped contact diffusion region is doped to a degree that it forms a layer that is conductive under operation.

5. The pixel of claim 1 wherein said doped contact diffusion region isolates said collection node from defects in an interface between said at least one interconnect layer and said at least one semiconductor material.

6. The pixel of claim 1, wherein said at least one interconnect layer comprises a plurality of interconnect layers selected from the group of layers consisting of a dielectric layer and a conductive layer.

7. The pixel of claim 1 wherein said reset enables use of correlated double sampling.

8. The pixel of claim 1 wherein said photodiode structure further comprises at least one organic material.

9. The pixel of claim 8 wherein said at least one organic material contains a suspension of photoactive material.

10. The pixel of claim 1 wherein the interconnect comprises a metal.

11. The pixel of claim 1 wherein the semiconductor material has a same doping type as the collection node.

* * * * *